(12) United States Patent
Nie et al.

(10) Patent No.: US 9,073,751 B2
(45) Date of Patent: Jul. 7, 2015

(54) QUANTUM DOTS, METHODS OF MAKING QUANTUM DOTS, AND METHODS OF USING QUANTUM DOTS

(75) Inventors: Shuming Nie, Atlanta, GA (US); Andrew M. Smith, Atlanta, GA (US); Brad A. Kairdolf, Lilburn, GA (US)

(73) Assignee: EMORY UNIVERSITY, Atlanta, GA (US)

( * ) Notice: Subject to any disclaimer, the term of this patent is extended or adjusted under 35 U.S.C. 154(b) by 927 days.

(21) Appl. No.: 13/060,513

(22) PCT Filed: Sep. 3, 2009

(86) PCT No.: PCT/US2009/055831
§ 371 (c)(1),
(2), (4) Date: Mar. 22, 2011

(87) PCT Pub. No.: WO2010/028112
PCT Pub. Date: Mar. 11, 2010

(65) Prior Publication Data
US 2011/0260111 A1    Oct. 27, 2011

Related U.S. Application Data

(60) Provisional application No. 61/093,801, filed on Sep. 3, 2008.

(51) Int. Cl.
*B82Y 10/00* (2011.01)
*C09K 11/02* (2006.01)
*C01B 19/00* (2006.01)
*H01L 21/02* (2006.01)

(52) U.S. Cl.
CPC ............... *B82Y 10/00* (2013.01); *C01B 19/007* (2013.01); *C01P 2002/84* (2013.01); *C01P 2004/04* (2013.01); *C01P 2004/80* (2013.01); *C09K 11/025* (2013.01); *H01L 21/0256* (2013.01); *H01L 21/02562* (2013.01); *H01L 21/02568* (2013.01); *H01L 21/02601* (2013.01)

(58) Field of Classification Search
CPC .............................. C01B 19/007; C01B 19/04
USPC ...................... 252/301.4 R, 301.4 S, 301.6 R
See application file for complete search history.

(56) References Cited

U.S. PATENT DOCUMENTS

| 7,390,568 B2 | 6/2008 | Kim et al. |
| 7,405,002 B2 | 7/2008 | Ying et al. |
| 2002/0066401 A1 | 6/2002 | Peng et al. |
| 2004/0110002 A1 | 6/2004 | Kim et al. |

(Continued)

FOREIGN PATENT DOCUMENTS

| WO | 20060118542 A1 | 11/2006 |
| WO | 20060135387 A2 | 12/2006 |

(Continued)

OTHER PUBLICATIONS

Luccardini. Size, Charge, and Interactions with Giant Lipid Vesicles of Quantum Dots Coated with an Amphiphilic Macromolecule. Langmuir 2006, 22, 2304-2310.*

(Continued)

*Primary Examiner* — Matthew E Hoban
(74) *Attorney, Agent, or Firm* — Thomas|Horstemeyer, LLP

(57) ABSTRACT

Embodiments of the present disclosure provide: methods of making a quantum dot, quantum dots, and the like.

7 Claims, 3 Drawing Sheets

(56) References Cited

U.S. PATENT DOCUMENTS

| | | | |
|---|---|---|---|
| 2005/0059031 A1* | 3/2005 | Bruchez et al. | 435/6 |
| 2005/0136258 A1 | 6/2005 | Nie et al. | |
| 2005/0192430 A1* | 9/2005 | Rosenthal et al. | 530/391.3 |
| 2006/0169971 A1 | 8/2006 | Cho et al. | |
| 2007/0160838 A1* | 7/2007 | Bawendi et al. | 428/403 |

FOREIGN PATENT DOCUMENTS

| | | |
|---|---|---|
| WO | 2007018647 A2 | 2/2007 |
| WO | 2008116044 A1 | 9/2008 |

OTHER PUBLICATIONS

The Supplementary European Search Report dated Jun. 8, 2012.

Kim, et al., "Near-Infrared Fluorescent Type II Quantum Dots for Sentinel Lymph Node Mapping," Nature Biotechnology, Nature Publishing Group, vol. 22, No. 1, Jan. 1, 2004.

Heonjin, et al., "InSitu Synthesis of CdTe/CdSe Core-Shell Quantum Dots," Chemistry of Materials, vol. 19, No. 11, Apr. 5, 2007, pp. 2715-2717.

Pellegrino, et al., "Hydrophobic Nanocrystals Coated with an Amphiphilic Polymer Shell: A General Route to Water Soluble Nanocrystals," Nano Letters, vol. 4, No. 4, Apr. 1, 2004, pp. 703-707.

Yu, et al., "Water-Soluble Quantum Dots for Biomedical Applications," Biochemical and Biophysical Research Communications, Academic Press, Inc., vol. 348, No. 3, Sep. 29, 2006, pp. 781-786.

Wu, et al., "Immunofluorescent Labeling of Cancer Marker HER2 and Other Cellular Targets with Semiconductor Quantum Dots," Nature Biotechnology, Nature Publishing Group, vol. 21, Jan. 1, 2003, pp. 41-46.

Gao, et al., "In Vivo Cancer Targeting and Imaging with Semiconductor Quantum Dots," Nature Biotechnology, Nature Publishing Group, vol. 22, No. 8, Jul. 18, 2004, pp. 969-976.

Tang, et al., "Electroluminescence from Organic/Inorganic Heterostructure Device Based on Blends of PVK and Water-Sol CdSe Nanocrystals," Journal of Photochemistry and Photobiology, A: Chemistry, vol. 192, No. 1, Oct. 19, 2007, pp. 1-7.

The International Search Report and Written Opinion dated Mar. 15, 2010.

Peng, et al., J. Am. Chem. Soc. 2001, vol. 123, pp. 183-184, Dec. 9, 2000.

The International Preliminary Report on Patentability dated Mar. 17, 2011.

* cited by examiner

US 9,073,751 B2

QUANTUM DOTS, METHODS OF MAKING QUANTUM DOTS, AND METHODS OF USING QUANTUM DOTS

CROSS REFERENCE TO RELATED APPLICATION

This application claims priority to the PCT application entitled "QUANTUM DOTS, METHODS OF MAKING QUANTUM DOTS, AND METHODS OF USING QUANTUM DOTS," having serial number PCT/US2009/055,831, filed on Sep. 3, 2009. This application also claims priority to and benefit of U.S. Provisional Patent Application No. 61/093,801, filed on Sep. 3, 2008 which is incorporated by reference in their entirety.

STATEMENT REGARDING FEDERALLY SPONSORED RESEARCH OR DEVELOPMENT

This invention was made with government support under Grant No.: GM072069 awarded by the NIH. The government has certain rights in the invention.

BACKGROUND

Semiconductor quantum dots (QDs) are nanometer-sized particles with unique optical and electronic properties, and are currently under intensive research for a broad range of applications such as solar energy conversion and molecular and cellular imaging. Significant advances have been made in the chemical synthesis of highly crystalline and monodispersed QDs, especially with the use of organometallic and chelated cadmium precursors, noncoordinating solvents, and inorganic passivating shells. However, the resulting nanocrystals are often hydrophobic and must be encapsulated and solubilized post synthesis for many important applications. Aqueous synthetic procedures have been used as alternative approaches to prepare water soluble QDs, using small thiol-containing molecules or polymers with carboxylic acid functional groups as stabilizing agents. But these methods do not yield QDs with the fluorescence brightness or size monodispersity that are often achieved with the high-temperature organic procedures.

SUMMARY

Embodiments of the present disclosure provide: methods of making a quantum dot, quantum dots, and the like. Embodiments of the method of making a quantum dot, among others, include: mixing an amphiphilic polymer dissolved in a non-coordinating solvent with a first precursor to produce a carboxylate precursor; mixing the carboxylate precursor with a second precursor to form a quantum dot core; mixing the dot core with a precursor selected from the group consisting of: a third precursor, a fourth precursor, and a combination thereof, to form a quantum dot cap on the quantum dot core to form a quantum dot, where the quantum dot includes a layer of amphiphilic polymer disposed on the surface of the quantum dot. Embodiments of the present disclosure include quantum dots made form this method.

Embodiments of the methods of making a quantum dot, among others, include: mixing an amphiphilic polymer dissolved in PEG with a CdO to produce a carboxylate precursor; mixing the carboxylate precursor with a tellurium precursor to form a CdTe core; mixing the CdTe quantum dot core with a selenium precursor to form a CdSe cap on the CdTe core to form a CdTe/CdSe quantum dot, where the CdTe/CdSe quantum dot includes a layer of amphiphilic polymer disposed on the surface of the CdTe/CdSe quantum dot. Embodiments of the present disclosure include quantum dots made form this method.

Embodiments of a quantum dot, among others, include: a CdSe cap on the CdTe core to form a CdTe/CdSe quantum dot, wherein the CdTe/CdSe quantum dot includes a layer of amphiphilic polymer disposed on the surface of the CdTe/CdSe quantum dot.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2A is a gray scale photograph of a series of monodispersed CdTe QDs, showing bright fluorescence from green to red (515 nm to 655 nm) upon illumination with a UV lamp. FIG. 2B is a normalized band-edge fluorescence emission spectra of CdTe QDs with 35-50 nm full width at half maximum (FWHM) (QY~30%). FIG. 2B is a representative emission spectra for QDs of various sizes (blue to maroon). As the particles grow, the emission is red-shifted, resulting in a shift in the spectra. FIG. 2C is a transmission electron micrograph of CdTe cores (emission=655 nm) showing uniform, nearly spherical particles (mean diameter=4.2 nm, standard deviation~10%).

FIG. 3A) is a digital image of normalized fluorescence emission spectra showing the transition from CdTe cores to CdTe/CdSe core-shell QDs emitting in the near-infrared. FIG. 3A corresponds to the emission spectra of the particles as a passivating shell is grown. The red curve is just the core (in this case, CdTe) with no shell. As a shell is grown, the emission spectrum shifts to the red (towards the black curve). FIG. 3B is a graph showing an optical absorbance showing the red-shifting and eventual loss of the first exciton peak as the CdSe shell is grown on the CdTe core, typical of type II QDs. FIG. 3B corresponds to the absorption spectra of the particles as a passivating shell is grown. The red curve is just the core (in this case, CdTe) with no shell. As a shell is grown, the absorption peak shifts to the red. Also, because this shell material results in a type II QD, the absorption spectra should lose it's peak (as shown in the black curve), proving that shell growth was successful.

FIG. 4A illustrates the fluorescence wavelength and full width half max (FWHM) as a function of time and polymer concentration, showing a decrease in nanoparticle growth rate with increasing polymer precursor concentration (opposite effect seen with monovalent precursors). FIG. 4B illustrates preparing a reaction flask containing both precursors and then rapidly increasing temperature results in nucleation of nanoparticles without the need of an injection step, which is necessary for synthesis using monovalent precursors. FIG. 4B represents emission spectra from a reaction where all materials were added in a single vessel at low temps and the temp was increased to induce nucleation (rather than preparing the precursors separately and adding one to the other at high temperatures). The curves show the gradual appearance of a characteristic QD emission, indicating that QD synthesis was successful using this method.

FIG. 5A illustrates the temporal evolution of the absorption spectra for CdTe cores synthesized using the amphiphilic multidentate ligand procedure. FIG. 5B illustrates the reaction kinetics of the multidentate ligands compared to traditional monodentate ligands.

DETAILED DESCRIPTION

Figure 1:
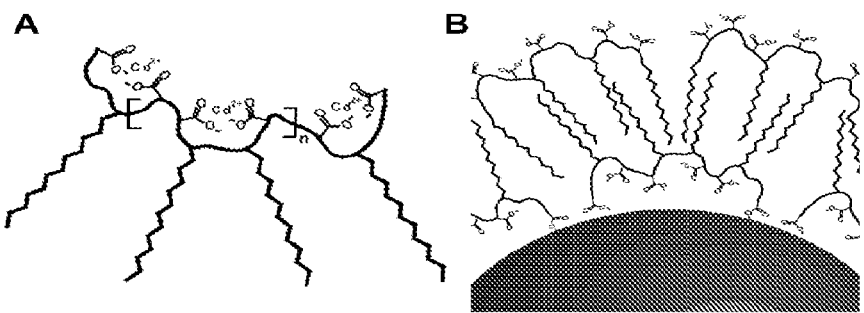
FIG. 1A is a schematic structure of the amphiphilic multidentate ligand with multiple chelated cadmium ions.
FIG. 1B is a diagram showing multidentate ligand binding to the QD surface. The resulting nanocrystals are spontaneously encapsulated and solubilized by a second layer of the same multidentate polymer upon exposure to water.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic organic chemistry, biochemistry, biology, molecular biology, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Definitions

In describing and claiming the disclosed subject matter, the following terminology will be used in accordance with the definitions set forth below.

The term "quantum dot" (QD) as used herein refers to semiconductor nanocrystals or artificial atoms, which are semiconductor crystals that contain anywhere between 100 to 1,000 electrons and range from about 2-10 nm. Some QDs can be between about 1-40 nm in diameter. QDs have high quantum yields, which makes them particularly useful for optical applications. QDs are fluorophores that fluoresce by forming excitons, which can be thought of as the excited state of traditional fluorophores, but have much longer lifetimes of up to 200 nanoseconds. This property provides QDs with low photobleaching. The energy level of QDs can be controlled by changing the size and shape of the QD and the depth of the QDs' potential. One of the optical features of small excitonic QDs is coloration, which is determined by the size of the dot. The larger the dot, the redder, or more towards the red end of the spectrum the fluorescence. The smaller the dot, the bluer or more towards the blue end it is. The bandgap energy that determines the energy and hence the color of the fluoresced light is inversely proportional to the square of the size of the QD. Larger QDs have more energy levels which are more closely spaced, thus allowing the QD to absorb photons containing less energy, e.g., those closer to the red end of the spectrum. Because the emission frequency of a dot is dependent on the bandgap, it is therefore possible to control the output wavelength of a dot with extreme precision.

The term "aliphatic group" refers to a saturated or unsaturated linear or branched hydrocarbon group and encompasses alkyl, alkenyl, and alkynyl groups, for example.

The terms "alk" or "alkyl" refer to straight or branched chain hydrocarbon groups having 1 to 12 carbon atoms, preferably 1 to 8 carbon atoms, such as methyl, ethyl, n-propyl, i-propyl, n-butyl, i-butyl, t-butyl, pentyl, hexyl, heptyl, n-octyl, dodecyl, octadecyl, amyl, 2-ethylhexyl, and the like. The term "substituted alkyl" refers to alkyl groups substituted with one or more groups, preferably selected from aryl, substituted aryl, heterocyclo, substituted heterocyclo, carbocyclo, substituted carbocyclo, halo, hydroxy, protected hydroxy, alkoxy (e.g., $C_1$ to $C_7$) (optionally substituted), acyl (e.g., $C_1$ to $C_7$), aryloxy (e.g., $C_1$ to $C_7$) (optionally substituted), alkylester (optionally substituted), arylester (optionally substituted), alkanoyl (optionally substituted), aryol (optionally substituted), carboxy, protected carboxy, cyano, nitro, amino, substituted amino, (monosubstituted)amino, (disubstituted)amino, protected amino, amido, lactam, urea, urethane, sulfonyl, etc.

The term "alkenyl" refers to straight or branched chain hydrocarbon groups having 2 to 12 carbon atoms, preferably 2 to 4 carbon atoms, and at least one double carbon to carbon bond (either cis or trans), such as ethenyl. The term "substituted alkenyl" refers to alkenyl groups substituted with one or more groups, preferably selected from aryl, substituted aryl, heterocyclo, substituted heterocyclo, carbocyclo, substituted carbocyclo, halo, hydroxy, alkoxy (optionally substituted), aryloxy (optionally substituted), alkylester (optionally substituted), arylester (optionally substituted), alkanoyl (optionally substituted), aryol (optionally substituted), cyano, nitro, amino, substituted amino, amido, lactam, urea, urethane, sulfonyl, and the like.

The term "alkynyl" refers to straight or branched chain hydrocarbon groups having 2 to 12 carbon atoms, preferably 2 to 4 carbon atoms, and at least one triple carbon to carbon bond, such as ethynyl. The term "substituted alkynyl" refers to alkynyl groups substituted with one or more groups, preferably selected from aryl, substituted aryl, heterocyclo, substituted heterocyclo, carbocyclo, substituted carbocyclo, halo, hydroxy, alkoxy (optionally substituted), aryloxy (optionally substituted), alkylester (optionally substituted), arylester (optionally substituted), alkanoyl (optionally substituted), aryol (optionally substituted), cyano, nitro, amino, substituted amino, amido, lactam, urea, urethane, sulfonyl, and the like.

Use of the phrase "biomolecule" is intended to encompass deoxyribonucleic acid (DNA), ribonucleic acid (RNA), nucleotides, oligonucleotides, nucleosides, polynucleotides, proteins, peptides, polypeptides, selenoproteins, antibodies, antigens, protein complexes, aptamers, haptens, combinations thereof, and the like.

Use of "biological" or "biological target" is intended to encompass biomolecules (e.g., deoxyribonucleic acid (DNA), ribonucleic acid (RNA), nucleotides, oligonucleotides, nucleosides, polynucleotides, proteins, peptides, polypeptides, selenoproteins, antibodies, antigens, protein complexes, aptamers, haptens, combinations thereof) and the like. In particular, biological or biological target can include, but is not limited to, naturally occurring substances such as polypeptides, polynucleotides, lipids, fatty acids, glycoproteins, carbohydrates, fatty acids, fatty esters, macromolecular polypeptide complexes, vitamins, co-factors, whole cells, eukaryotic cells, prokaryotic cells, micelles, microorganisms such as viruses, bacteria, protozoa, archaea, fungi, algae, spores, apicomplexan, trematodes, nematodes, mycoplasma, or combinations thereof. In addition, the biological target can include native intact cells, viruses, bacterium, and the like.

Use of the term "affinity" can include biological interactions and/or chemical interactions. The biological interactions can include, but are not limited to, bonding or hybridization among one or more biological functional groups located on the first biomolecule or biological target and the second biomolecule or biological target. In this regard, the first (or second) biomolecule can include one or more biological functional groups that selectively interact with one or more biological functional groups of the second (or first) biomolecule. The chemical interaction can include, but is not limited to, bonding among one or more functional groups (e.g., organic and/or inorganic functional groups) located on the biomolecules.

"Treating" or "treatment" of a disease (or a condition or a disorder) includes preventing the disease from occurring in an animal that may be predisposed to the disease but does not yet experience or exhibit symptoms of the disease (prophylactic treatment), inhibiting the disease (slowing or arresting its development), providing relief from the symptoms or side-effects of the disease (including palliative treatment), and relieving the disease (causing regression of the disease). With regard to cancer, these terms also mean that the life expectancy of an individual affected with a cancer will be increased or that one or more of the symptoms of the disease will be reduced.

As used herein, the term "host" or "organism" includes humans, mammals (e.g., cats, dogs, horses, etc.), living cells, and other living organisms. A living organism can be as simple as, for example, a single eukaryotic cell or as complex as a mammal. Typical hosts to which embodiments of the present disclosure may be administered will be mammals, particularly primates, especially humans. For veterinary applications, a wide variety of subjects will be suitable, e.g., livestock such as cattle, sheep, goats, cows, swine, and the like; poultry such as chickens, ducks, geese, turkeys, and the like; and domesticated animals particularly pets such as dogs and cats. For diagnostic or research applications, a wide variety of mammals will be suitable subjects, including rodents (e.g., mice, rats, hamsters), rabbits, primates, and swine such as inbred pigs and the like. Additionally, for in vitro applications, such as in vitro diagnostic and research applications, body fluids and cell samples of the above subjects will be suitable for use, such as mammalian (particularly primate such as human) blood, urine, or tissue samples, or blood, urine, or tissue samples of the animals mentioned for veterinary applications. In some embodiments, a system includes a sample and a host. The term "living host" refers to host or organisms noted above that are alive and are not dead. The term "living host" refers to the entire host or organism and not just a part excised (e.g., a liver or other organ) from the living host.

The term "sample" can refer to a tissue sample, cell sample, a fluid sample, and the like. The sample may be taken from a host. The tissue sample can include hair (including roots), buccal swabs, blood, saliva, semen, muscle, or from any internal organs. The fluid may be, but is not limited to, urine, blood, ascites, pleural fluid, spinal fluid, and the like. The body tissue can include, but is not limited to, skin, muscle, endometrial, uterine, and cervical tissue. In the present disclosure, the source of the sample is not critical.

The term "detectable" refers to the ability to detect a signal over the background signal.

The term "detectable signal" is a signal derived from quantum dots. The detectable signal is detectable and distinguishable from other background signals that may be generated from the host. In other words, there is a measurable and statistically significant difference (e.g., a statistically significant difference is enough of a difference to distinguish among the acoustic detectable signal and the background, such as about 0.1%, 1%, 3%, 5%, 10%, 15%, 20%, 25%, 30%, or 40% or more difference between the detectable signal and the background) between detectable signal and the background. Standards and/or calibration curves can be used to determine the relative intensity of the acoustic detectable signal and/or the background.

Discussion

In accordance with the purpose(s) of the present disclosure, as embodied and broadly described herein, embodiments of the present disclosure, in one aspect, relate to quantum dots, methods of making quantum dots, methods of using quantum dots, and the like. In particular, embodiments of the present disclosure include making quantum dots using an "all-in-one" strategy for synthesizing, encapsulating, and solubilizing quantum dots, while still producing quantum dots having detectable signals. The quantum dots can be used in many areas such as, but not limited to, imaging (in vitro and in vivo), biosensing, biolabeling, gene expression studies, protein studies, medical diagnostics, diagnostic libraries, microfluidic systems, delivery vehicles, lithography and patterning, and the like.

Embodiments of the present disclosure provide for a "one-pot" procedure (e.g., the quantum dots can be prepared in a single reaction vessel) for producing water-soluble, core-shell quantum dots. Embodiments of the present disclosure include using amphiphilic multidentate ligands and non-coordinating solvents. Use of the amphiphilic multidentate ligands and non-coordinating solvents are advantageous for at least the following reasons: increased particle solubility, enhanced control of particle growth kinetics, and/or the ability to produce ultrasmall quantum dots. Embodiments of the present disclosure provide for an in-situ growth process of inorganic passivating quantum dot shell on a quantum dot core. In addition, embodiments of the present disclosure can use an excess of amphiphilic polymer, which allows immediate transfer of quantum dots into a number of solvents such as water, acetone, dimethylformamide (DMF), dimethyl sulfoxide (DMSO), methanol, ethanol, propanol, butanol, chloroform, dichloromethane (DCM), tetrahydrofuran (THF), toluene, and any combination thereof. Additional details are described in the Examples.

In general, embodiments of the present disclosure provide for methods of making quantum dots. The method includes mixing an amphiphilic polymer dissolved in a non-coordinating solvent with a first precursor to produce a carboxylate precursor. In an embodiment, the temperature can be about 25° C. to 300° C., and the pH depends on the solvent (e.g., for PEG, it is roughly neutral; for hydrophobic solvents, the pH is acidic (below 7) to keep the carboxylic acid groups protonated for solubility reasons).

Then the carboxylate precursor is mixed with a second precursor to form a quantum dot core. In an embodiment, the temperature and pH are similar to that described above. In an embodiment, the addition of the second precursor involves a quick injection at high temperatures (e.g., about 200° C. to 350° C.).

Subsequently, the quantum dot core is mixed with a precursor (e.g., a third precursor, a fourth precursor, or a combination thereof) to form a quantum dot cap on the quantum dot core to form a quantum dot. The quantum dot includes a layer of amphiphilic polymer disposed on the surface of the quantum dot. In an embodiment, the temperature is about 150° C. to 350° C. Additional details regarding embodiments of the quantum dots and methods of making the quantum dots of the present disclosure are described in the Examples.

The mixing of the components described above can be conducted in a single reaction vessel. In addition, the quantum dot cap and layer of amphiphilic polymer can be formed in situ. The temperature and environment of the reaction can be controlled using known methods and systems. Specific examples are described in the Examples. In an embodiment, the mixing steps could be conducted in separate reaction vessels, but it is advantageous to react in a single reaction vessel. The precursor materials, amphiphilic polymer, and/or the non-coordinating solvent can be pre-made in separate reaction vessels prior to being disposed in the reaction vessel to produce the quantum dots of the present disclosure. In the alternative, the components (e.g., a carboxylate precursor) could be added to the reaction vessel that the precursor materials, amphiphilic polymer, and/or the non-coordinating solvent were prepared in. Although each reaction step is not taking place in the same reaction vessel, each reaction step can be conducted in a single reaction vessel.

In an embodiment, the amphiphilic polymer can be an amphiphilic multidentate polymer. In an embodiment, the amphiphilic polymer can be a polymer containing both hydrophobic and hydrophilic portions with a functional group (e.g., carboxylic acid functional groups or phosphonic functional groups) capable of coordinating with the quantum dot atoms. The amphiphilic multidentate polymer contains aliphatic chains and carboxylic acid functional groups. In an embodiment the aliphatic chains can have about 2 to 20, about 6 to 16, or about 8 to 14 carbon chains. In an embodiment, the chains can be the same length or include chains of varying length. In an embodiment, the aliphatic chains can have a 12 carbon chain. In an embodiment, the amphiphilic multidentate polymer can include about 3 to hundreds (e.g., 100 to 500 or more), about 5 to 100, or about 8 to 24 carboxylic acid functional groups (or phosphonic groups in another embodiment). The amphiphilic multidentate polymer can have a molecular weight of about 500 to 100,000, about 2000 to 20,000, or about 2500 to 7500. In an embodiment, the amphiphilic multidentate polymer can include one or more of the following poly(acrylic acid)-dodecylamine, poly(acrylic acid)-octylamine, poly(maleic anhydride-alt-1-octadecene, poly(maleic anhydride-alt-1-tetradecene, combinations thereof, and the like.

The term "non-coordinating solvent" means that a solvent which does not or does not substantially coordinate or interact with the surface of the crystalline nanoparticle. In an embodiment, the non-coordinating solvent can include high boiling point solvents lacking functional groups that interact with the quantum dot. In an embodiment, water miscible solvents are necessary for the one-pot procedure to transfer to water. In another embodiment, hydrophobic solvents can be used to transfer the particles to other solvents such as those listed above. In an embodiment, the non-coordinating solvent can include polyethyleneglycol, octadecane, octadecene, hexadecane, hexadecene, and any combination thereof. In an embodiment, the polyethyleneglycol has a low molecular weight of about 150 to tens of thousands, about 200 to 1500, or about 250 to 1000 AMU.

The core and cap of the quantum dot can be made from three, four, or five or more precursors. In an embodiment using three precursors, one of the two precursors to produce the quantum dot core is allowed to be completely depleted so that the other of the precursors can then be mixed with a third precursor to produce the cap of the quantum dot. In another embodiment, four precursors are used. The two precursors used to form the core of the quantum dot are allowed to be completely depleted, and two additional precursors are added to form the cap of the quantum dot. For reasons of clarity, the following example illustrates the use of three precursors. However, four or more precursors could be used to form the quantum dot.

In an embodiment, the first precursor, second precursor, and the third precursor are components used to form the core and cap of the quantum dot. The first precursor, the second precursor, and the third precursor can be metals, metalloids, or chalcogenides, some of which are described in the present disclosure in the discussion of quantum dots. The first precursor, the second precursor, and the third precursor can be independently selected from: a Cd precursor (e.g., CdO, Cd acetate, cadmium acetylacetonate, $CdCl_2$, and the like), a Se precursor (e.g., pure selenium, Se with a coordinating ligand of tributylphosphine or trioctylphosphine, and the like), a Te precursor (e.g., pure tellurium, Te with a coordinating ligand of tributylphosphine or trioctylphosphine, and the like), a Hg precursor (e.g., mercury acetate, mercury oxide, mercury chloride, and the like), a Pb precursor (e.g., lead acetate, lead oxide, lead chloride, and the like), a Zn precursor (e.g., zinc acetate, zinc oxide, zinc chloride, and the like), and a S precursor (e.g., pure sulfur, sulfur with a coordinating ligand such as tributylphosphine or trioctylphosphine, and the like). The first precursor, the second precursor, and the third precursor can be different from each other.

Quantum dots can include, but are not limited to, luminescent semiconductor quantum dots. In general, quantum dots include a core and a cap, however, uncapped quantum dots can be used as well. The "core" is a nanometer-sized semiconductor. While any core of the IIA-VIA, IIIA-VA, or IVA-IVA, IVA-VIA semiconductors can be used in the context of the present disclosure, the core is such that, upon combination with a cap, a luminescent quantum dot results. A IIA-VIA semiconductor is a compound that contains at least one element from Group IIA and at least one element from Group VIA of the periodic table, and so on. The core can include two or more elements. In one embodiment, the core is an IIA-VIA, IIIA-VA, or IVA-IVA semiconductor that can be about 1 nm to 40 nm, about 1 nm to 30 nm, about 1 nm to 20 nm, or about 1 nm to 10 nm in diameter. In another embodiment, the core can be an IIA-VIA semiconductor and can be about 2 nm to 10 nm in diameter. For example, the core can be CdS, CdSe, CdTe, ZnSe, ZnS, PbS, PbSe, or an alloy. In an embodiment the core is CdTe.

The "cap" is a semiconductor that differs from the semiconductor of the core and binds to the core, thereby forming a surface layer on the core. The cap typically passivates the core by having a higher band gap than the core. In one embodiment, the cap can be a IIA-VIA semiconductor of high band gap. For example, the cap can be ZnS or CdS. Combinations of the core and cap can include, but are not limited to, the cap is ZnS when the core is CdSe or CdS, and the cap is CdS when the core is CdSe. Other exemplary quantum does include, but are not limited to, CdS, ZnSe, CdSe, CdTe, $CdSe_xTe_{1-x}$, InAs, InP, PbTe, PbSe, PbS, HgS, HgSe, HgTe, CdHgTe, and GaAs. The size of the cap can be about 0.1 to 10 nm, about 0.1 to 5 nm, or about 0.1 to 2 nm in diameter. In an embodiment, the cap is CdSe.

The wavelength emitted (e.g., color) by the quantum dots can be selected according to the physical properties of the quantum dots, such as the size and the material of the nanocrystal. Quantum dots are known to emit light from about 300 nanometers (nm) to 2000 nm (e.g., UV, near IR, and IR). The colors of the quantum dots include, but are not limited to, red, blue, green, and combinations thereof. The color or the fluorescence emission wavelength can be tuned continuously.

The wavelength band of light emitted by the quantum dot is determined by either the size of the core or the size of the core and cap, depending on the materials that make up the core and cap. The emission wavelength band can be tuned by varying the composition and the size of the QD and/or adding one or more caps around the core in the form of concentric shells.

In an embodiment, the core (first:second quantum dot core) can be CdSe, CdS, HgS, HgSe, PbS, PbSe, ZnS, ZnSe, ZnTe, and the like. In an embodiment, the cap (a first:third quantum dot cap) can be CdTe, CdS, CdSe, ZnS, and ZnSe. In an embodiment, the cap:core (first:second/first:third) combination can include CdTe/CdSe, CdSe/CdS, CdSe/ZnS, and CdTe/ZnSe. Additional details are described in the Examples.

As mentioned above, the amphiphilic polymer is dissolved in the non-coordinating solvent with the first precursor to produce a carboxylate precursor. In an embodiment of the present disclosure the carboxylate precursor can be described as an amphiphilic polymer with a hydrophobic and hydrophilic portion with multiple (2 or greater) coordinated precursor atoms (e.g., Cd, Zn, Hg, and the like).

As noted above, a layer of amphiphilic polymer is disposed on the surface of the quantum dot. In an embodiment, the layer of amphiphilic polymer can be described as a coordinating layer with the coordinating functional groups interacting with the surface of the quantum dot and the hydrophobic portion exposed to the solvent. In an embodiment, upon transfer to water, a second layer of amphiphilic polymer is deposited with the hydrophobic portion interacting with the hydrophobic portion of the first layer and the hydrophilic portion interacting with the aqueous solvent. The thickness of the layer can be about 0.5 to 10, about 1 to 5, or about 1.5 to 3 nm.

In an embodiment, the molar ratio of the polymer:first precursor (metal atom) is about 1:10 to 250:1 or about 1:5 to 10:1. In an embodiment, the molar ratio of the first precursor: second precursor is about 10:1 to 1:10 or about 1:1 to 3:1. In an embodiment, the molar ratio of the first precursor (metal atom):third precursor (metal atom) is about 10:1 to 1:10 or about 1:1 to 5:1. In an embodiment, the molar ratio of solvent to first precursor (metal atom) can be about 150:1. This ratio gives a final concentration of approximately 20 mM for the first precursor (metal atom), but could be from about 5 mM to 50 mM. In an embodiment, any combination of the ratios noted above could be combined if appropriate to produce the desired quantum dot.

In a particular embodiment, a CdTe/CdSe quantum dot having a layer of amphiphilic polymer disposed on the surface of the CdTe/CdSe quantum dot can be formed using methods of the present disclosure. Details regarding methods of making CdTe/CdSe quantum dots are described in the Examples.

In an embodiment, an amphiphilic polymer is dissolved in PEG and mixed with a Cd precursor (e.g., CdO) to produce a carboxylate precursor. The amphiphilic polymer can be any of the amphiphilic polymers mentioned above. In an embodiment the amphiphilic polymer can be poly(acrylic acid)-dodecylamine, poly(acrylic acid)-octylamine, poly(maleic anhydride-alt-1-octadecene, poly(maleic anhydride-alt-1-tetradecene, combinations thereof, and the like. The PEG can be mixed with any of the amphiphilic polymers mentioned above. In an embodiment, the PEG can be PEG 250 (molecular weight of 250), PEG 350 (molecular weight of 350), or PEG 1000 (molecular weight of 1000). In an embodiment, the carboxylate precursor can be any of the carboxylate precursors noted above. In an embodiment, the carboxylate precursor can be (be poly(acrylic acid)-dodecylamine, poly(acrylic acid)-octylamine, poly(maleic anhydride-alt-1-octadecene, poly(maleic anhydride-alt-1-tetradecene, combinations thereof, and the like, each coordinated with a metal ion, for example. In an embodiment, the temperature can be about 50° C. to 250° C., about 75° C. to 150° C., or about 100° C. The pH will depend on the solvent used.

In an embodiment, the carboxylate precursor is mixed with a tellurium precursor to form a CdTe core. The tellurium precursor can be any of the tellurium precursors noted above. In an embodiment, the tellurium precursor is pure tellurium, Te with coordinating ligand of tributylphosphine or trioctylphosphine, or the like. The CdTe core can have a diameter of about 1.5 to 10 nm. In an embodiment, the temperature can be about 25° C. to 300° C. or about 100° C. to 200° C.

In an embodiment, the CdTe quantum dot core is mixed with a selenium precursor to form a CdSe cap on the CdTe core to form a CdTe/CdSe quantum dot. The process also forms a layer of amphiphilic polymer disposed on the surface of the CdTe/CdSe quantum dot. The CdTe/CdSe quantum dot can have a diameter of about 3 to 20 nm. The layer can have a diameter of about 0.25 to 10 nm. The CdTe/CdSe quantum dot plus the layer can have a diameter of about 5 to 50. The CdTe/CdSe quantum dot can have an emission spectrum of about 500 to 1200 nm. The selenium precursor can be any of the selenium precursors noted above. In an embodiment, the selenium precursor is pure selenium or selenium with a coordinating ligand such as tributylphosphine, trioctylphosphine. The layer of amphiphilic polymer can be any of one of those described above. In an embodiment, the layer of amphiphilic polymer can be poly(acrylic acid)-dodecylamine, poly(acrylic acid)-octylamine, poly(maleic anhydride-alt-1-octadecene, poly(maleic anhydride-alt-1-tetradecene, or combinations thereof. In an embodiment, the reaction temperature can be about 100° C. to 300° C. or about 150° C. to 250° C. (e.g., temperature gradually increases as more shell material is grown on the core).

The CdTe/CdSe quantum dot having the layer can be dissolved in water, acetone, dimethylformamide (DMF), chloroform, dimethyl sulfoxide (DMSO), methanol, ethanol, propanol, butanol, chloroform, dichloromethane (DCM), tetrahydrofuran (THF), toluene and any combination thereof.

In an embodiment, the relative amounts of the various components can be described using ratios of the various components. In an embodiment, the polymer to Cd metal atom molar ratio can be about 1:10 to 250:1 or about 1:5 to 10:1; a Cd atom:Te atom molar ratio can be about 10:1 to 1:10 or about 1:1 to 3:1; and a Cd atom:Se atom molar ratio can be about 1:10 to 10:1 or about 1:1 to 5:1. In an embodiment, a solvent to Cd metal atom molar ratio can be about 150:1. In an embodiment, the final concentrations for the Cd metal atom can be about 5 mM to 50 mM or about 20 mM.

Additional details regarding an embodiment of the present disclosure are described in the Examples.

The mixing of the components described above can be conducted in a single reaction vessel. In addition, the quantum dot cap and layer of amphiphilic polymer can be formed in situ. The temperature and environment of the reaction can be controlled using known methods and systems. Specific examples are described in the Examples. In an embodiment, the mixing steps could be conducted in separate reaction vessels, but it is advantageous to react in a single reaction vessel. The precursor materials, amphiphilic polymer, and/or the non-coordinating solvent can be pre-made in separate reaction vessel prior to being disposed in the reaction vessel to produce the quantum dots of the present disclosure. In the alternative, the components (e.g., a carboxylate precursor) could be added to the reaction vessel that the precursor materials, amphiphilic polymer, and/or the non-coordinating solvent were prepared in. Although each reaction step is not taking place in the same reaction vessel, each reaction step can be conducted in a single reaction vessel.

Methods of Use

As mentioned above, the present disclosure relates generally to methods for detecting, localizing, and/or quantifying biological targets, cellular events, diagnostics, cancer and disease imaging, gene expression, protein studies and interactions, and the like. The present disclosure also relates to methods for multiplex imaging inside a host living cell, tissue, or organ, or a host living organism, using embodiments of the present disclosure.

The biological target can include, but is not limited to, viruses, bacteria, cells, tissue, the vascular system, microorganisms, artificially constituted nanostructures (e.g., micelles), proteins, polypeptides, antibodies, antigens, aptamers (polypeptide and polynucleotide), haptens, polynucleotides, and the like, as well as those biological targets described in the definition section above.

Kits

This disclosure encompasses kits, which include, but are not limited to, quantum dots and directions (written instructions for their use). The components listed above can be tailored to the particular study to be undertaken. The kit can further include appropriate buffers and reagents known in the art for administering various combinations of the components listed above to the host cell or host organism.

In addition, this disclosure encompasses kits, which include, but are not limited to, components to make the quantum dots and directions for making the quantum dots.

EXAMPLES

Now having described the embodiments of the present disclosure, in general, the Examples describe some additional embodiments of the present disclosure. While embodiments of the present disclosure are described in connection with the Examples and the corresponding text and figures, there is no intent to limit embodiments of the present disclosure to these descriptions. On the contrary, the intent is to cover all alternatives, modifications, and equivalents included within the spirit and scope of embodiments of the present disclosure.

Example 1

Brief Introduction:

This Example describes a "one-pot" synthesis, encapsulation, and solubilization of high-quality quantum dots based on the use of amphiphilic and multidentate polymer ligands. In this "all-in-one" procedure, the resulting QDs are first capped by the multidentate ligand, and are then spontaneously encapsulated and solubilized by a second layer of the same multidentate polymer upon exposure to water. In addition to providing better control of nanocrystal nucleation and growth kinetics (including resistance to Ostwald ripening), this procedure allows for in-situ growth of an inorganic passivating shell on the nanocrystal core, enabling one-pot synthesis of both type-I and type-II core-shell QDs with tunable light emission from visible to near-infrared wavelengths.

Discussion:

This one-pot method for the simultaneous synthesis, encapsulation, and solubilization of high-quality quantum dots is based on the use of amphiphilic multidentate ligands and noncoordinating solvents such as low-molecular weight polyethylene glycols (PEG) (MW=350 Daltons). The multidentate polymer ligands contain aliphatic chains and carboxylic acid functional groups, and are found to act as both a cadmium precursor ligand and a nanoparticle surface stabilizer, leading to improved control of chemical reaction kinetics and increased resistance to Ostwald ripening. When exposed to water, excess polymer molecules spontaneously encapsulate and solubilize the QDs without any additional materials or steps. Furthermore, this synthetic procedure allows for in-situ growth of an inorganic passivating shell on the nanocrystal core, enabling one-pot synthesis of both type-I and type-II core-shell QDs (See, *J. Am. Chem. Soc.* 2003, 125, 11466-11467, which is incorporated herein by reference).

FIGS. 1A and 1B show the schematic structures of the multidentate polymer ligands for one-pot QD synthesis and the self-encapsulated QDs. An intermediate is a cluster of chelated cadmium ions, generated by dissolving the amphiphilic polymer and cadmium oxide or cadmium acetate in noncoordinating polyethylene glycols at elevated temperatures. The reactivity of this clustered cadmium precursor plays an important role in controlling the nucleation and growth kinetics of nanocrystals. By increasing the length of the polymer backbone and the density of hydrophobic side chains, a dramatic steric hindrance effect comes into play resulting in homogeneous nucleation and growth, whereas the use of traditional monovalent ligands leads to uncontrollable and heterogeneous reactions (data not shown). By optimizing the balance between the hydrophobic and hydrophilic segments, the resulting QDs are spontaneously solubilized by a second layer of the same amphiphilic polymer when the reaction mixture is exposed to water (see FIG. 1B). However, if the hydrophobic grafting percentage is too high, the number of surface carboxylic acid functional groups becomes too low for water solubilization. It has been found that about a 40 percent graft percentage (that is, about 40% of the carboxylic acid groups are modified with hydrophobic 12-carbon aliphatic size chains) is advantageous for controlled nanoparticle growth and for solubilizing the capped QDs in water.

Figure 2:
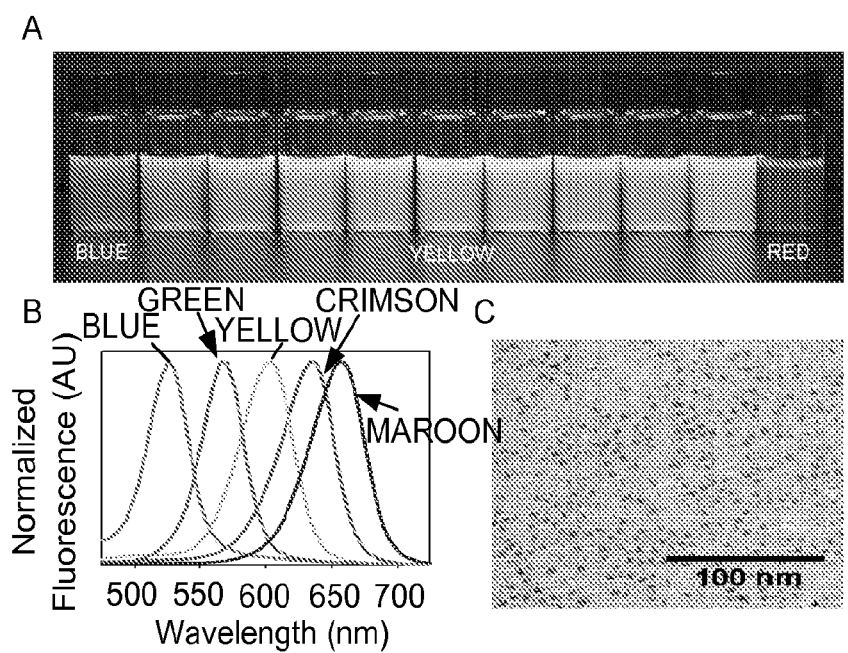
FIGS. 2A to 2C are digital images of a fluorescence emission and electron-microscopy structural properties of CdTe core QDs prepared by using multidentate polymer ligands in a one-pot procedure.

This improved control in reaction kinetics allows more precise tuning of the nanoparticle size and fluorescence emission wavelength across a wide range (FIG. 2A). In fact, QD fluorescence emission can be consistently controlled within as little as 2 nm. This high precision will become important as QDs are increasingly adopted for multiplexed biological and clinical assays, where consistency and repeatability are critical. The use of multidentate polymer precursors also provides a new route to ultrasmall QDs; for example, small CdTe cores emitting in the green range (515-525 nm, as small as 1.5 nm) can be synthesized with narrow size distributions, allowing for a very large dynamic range from the green to the far red wavelengths (FIG. 2A). It is worth noting that ultrasmall QDs are often difficult to synthesize with traditional monovalent precursors because of problems with kinetic control of small particles. The QDs capped with multidentate ligands are also strongly resistant to Ostwald ripening. In fact, each polymer has approximately 15 carboxylic acid functional groups that are capable of coordinating with surface atoms. By increasing the overall binding affinity through multivalent interactions and providing steric hindrance, the polymer capping can better stabilize the nanoparticles and reduce ripening. However, some ripening does occur at increased temperatures after long periods of time, as shown by maroon curve obtained after 1 hour at 280° C. (FIG. 2B, slight tailing). Overall, transmission electron microscopy reveals uniform, nearly spherical particles without clustering or aggregation (FIG. 2C), confirming the stability and monodispersity of QDs synthesized and protected with multidentate ligands.

Figure 3:
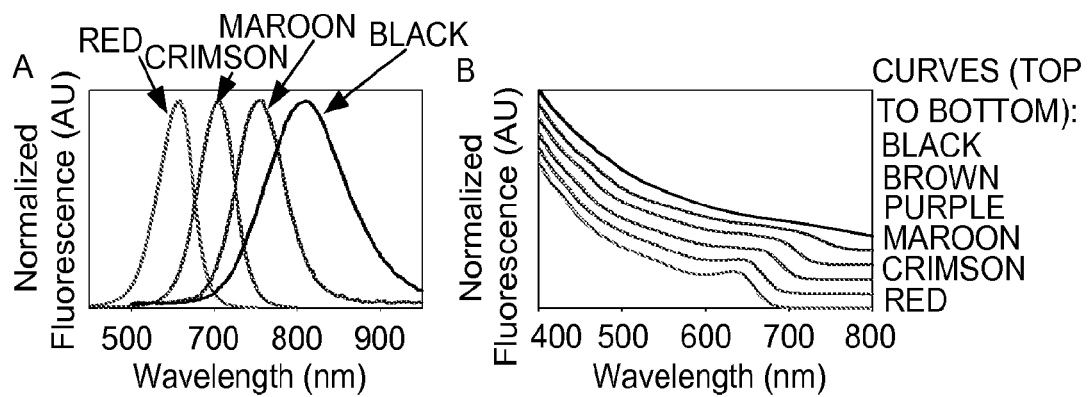
FIGS. 3A to 3B illustrate type-II core-shell CdTe/CdSe QDs synthesized in one pot.

Because QD cores show a propensity to oxidize in water, an in-situ procedure was developed for capping them with an inorganic passivating shell. Inorganic shells have the added benefit of increasing the quantum yield as well as opening the possibility of bandgap engineering through the selection of an appropriate shell material. In this procedure, an excess of cadmium is used to start the synthesis (the mole ratio of cadmium to tellurium mole is typically 2:1), and the reaction is allowed to proceed until the limiting species (tellurium) is depleted. This leaves an excess of the cadmium precursor available for incorporation into a passivating shell. CdSe is used as a model shell material for CdTe cores because the band offsets are such that CdTe/CdSe is a type-II QD with light emission in the near-infrared spectrum (See, *J. Am. Chem. Soc.* 2003, 125, 11466-11467, which is incorporated herein by reference). Fluorescence emission spectra (FIG. 3A) show significant red-shifting of the original QD core emission, from 650 nm to 810 nm, as a shell is grown on the particle surface (QYs consistent with those reported in literature (See, *J. Am. Chem. Soc.* 2003, 125, 11466-11467, which is incorporated herein by reference). Considerable broadening of the emission peak is observed with shell growth, consistent with the behavior of type-II QDs. Monitoring of the QD absorbance spectra also confirms shell growth and transition to type-II behavior (FIG. 3B). For example, the distinct exciton peak seen in the CdTe cores (red curve) is gradually red-shifted and eventually disappears during shell deposition. This is expected as the CdTe/CdSe QDs should behave as indirect semiconductors near the band edge.

The roles of low-molecular weight PEGs are also interesting. They provide not only an inert and noncoordinating environment for QD synthesis at high temperatures, but also act as an "adjuvant" to facilitate nanocrystal dissolution in various solvents. Indeed, the QDs reported in this work show "amphibious" behaviors and are soluble in a wide range of hydrophilic and hydrophobic solvents including water, DMF, acetone, and chloroform.

In summary, this example demonstrates an embodiment of a new, one-pot procedure for preparing high-quality QDs based on the use of amphiphilic multidentate ligands and short polyethylene glycols at high temperatures. Some new features associated with the use of polymeric precursors include, but are not limited to, better control of the nanocrystals growth kinetics, resistance to Oswald ripening, and/or synthesis of ultrasmall dots with blue-shifted emission spectra. This synthetic procedure also allows for in-situ growth of an inorganic passivating shell (CdSe) on the QD core, opening the possibility of bandgap engineering for these nanoparticles and providing a large dynamic range for QD emission from the visible to the near infrared.

Supporting Information
Polymer Synthesis:

The amphiphilic polymer (about 3500 Daltons) was synthesized using standard carbodiimide chemistry. Briefly, 518 mg of poly(acrylic) acid (MW=1800 Daltons) and 533 mg of dodecylamine were dissolved in 10 mL DMF. 609 mg of dicyclohexylcarbodiimide dissolved in a minimum amount of DMF were added dropwise and the solution was mixed vigorously for 24 hours to give an amphiphilic polymer with 40% of the carboxylic acid functional groups modified with a 12-carbon aliphatic chain.

Synthesis of CdTe Cores Using Multidentate Polymer Ligands:

Approximately 170 mg (0.6 mmol COOH groups) of the amphiphilic polymer (about 3500 MW, 40% graft percentage of dodecylamine to 1800 MW poly(acrylic) acid using carbodiimide coupling) were dissolved in 1.5 mL PEG (350 MW) at 100° C. under vacuum to remove water and dissolved gases. 12.84 mg (0.1 mmol) CdO were added and the solution was heated to 200° C. under Argon to form the carboxylate precursor. 2.8 mL PEG were added to dilute the solution and the remaining procedure was carried out under an inert environment using standard airless procedures. Solution was heated to 300° C. and a tellurium precursor solution (0.05 mmol Te dissolved in 25 µL tributylphosphine and 1 mL PEG at 200° C.) was quickly injected under vigorous stirring to initiate nanocrystal growth. Reaction progress was monitored by taking 250 µL aliquots at various time points using standard airless techniques and rapidly cooling to room temperature to halt the nanocrystal growth.

In-Situ Capping of CdTe Core QDs with CdSe:

CdTe cores were synthesized as described above. The reaction was allowed to proceed to completion to deplete Te precursor in solution (monitored by observing shift in fluorescence spectra). The solution was then cooled to 130-180° C. for the CdSe capping procedure. A 0.1 M selenium precursor solution was prepared using standard airless technique. Briefly, 78.96 mg Se was dissolved in 250 µL trubutylphosphine and 9.75 mL PEG at 50° C. and then cooled to room temperature. 2 mL of the Se precursor solution was added dropwise over the course of an hour while the core solution was vigorously stirred and the fluorescence and absorption spectra were observed to monitor the shell deposition.

Supplemental Information

Figure 4:
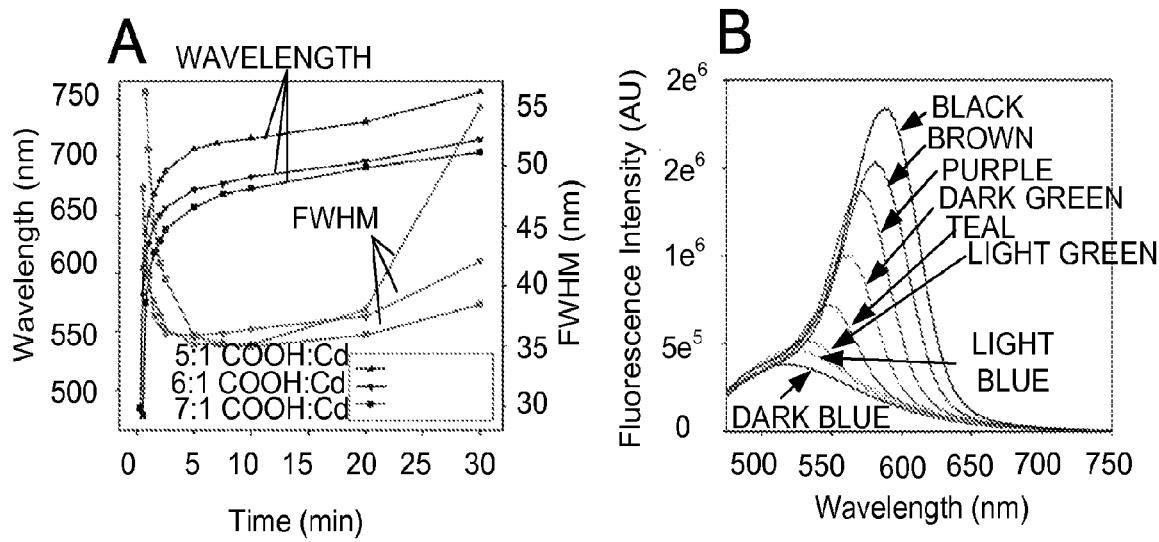
FIGS. 4A to 4B illustrate the unique growth properties of polymer synthesis procedure.

QD Synthesis and Reaction Kinetics:

Experiments were conducted to determine desirable reaction parameters for QD synthesis and analyze the nucleation and growth kinetics observed when using polymer ligands. QDs were prepared under conditions identical to the monovalent synthesis procedure, replacing cadmium oleate precursors with the multidentate cadmium precursors. Upon analysis of the growth kinetics of polymer-prepared QDs, a number of interesting properties were observed. By increasing the concentration of polymer in the reaction mixture (effectively increasing the COOH:Cd ratio), a decrease in the nucleation and growth kinetics was observed (FIG. 4A). This was unexpected, as an analysis of the reaction kinetics seen in monovalent synthesis techniques reveals the opposite effect.

It is possible that this difference is the result of steric hindrance from the multidentate polymer precursors. Using monovalent ligands for cadmium precursors, steric hindrance plays no significant role in the kinetics of nanoparticle nucleation or growth because the precursor is always composed of two oleic acid molecules coordinating a single cadmium ion, regardless of the oleic acid concentration. By increasing the concentration of oleic acid, only the reactivity of the cadmium chelate is affected by increasing the concentration of carboxylic acids present in the solution. Conversely, by altering the concentration of the multidentate polymer when preparing the cadmium precursor, the structure of the cadmium polyate is altered. At low polymer concentrations, the structure most likely obtained is one in which multiple cadmium ions are coordinated by a single polymer, as shown in the schematic representation in FIG. 1. However, as the concentration of the polymer increases, the number of cadmium ions per polymer decreases and the probability that a cadmium ion may be coordinated by carboxylic acid groups from separate polymers is higher. This phenomenon essentially allows the tuning of the effective molecular weight of the precursor by changing the polymer:cadmium ratio. Because of this increase in molecular weight, steric hindrance plays a role in the reaction kinetics. With increased steric hindrance, both nucleation and nanocrystal growth kinetics are retarded despite an increase in the concentration of carboxylic acids in solution, enabling an interesting method for controlling the nanoparticle growth.

Another interesting property of the polymer procedure for QD synthesis is the ability to perform "no-injection" nucleation of nanocrystals. For typical synthetic procedures using monovalent precursors, a solution of an anion chalcogen precursor (sulfur, selenium, tellurium) is prepared separately and then rapidly injected into the hot cadmium precursor solution to initiate nanoparticle nucleation and subsequent growth. This presents a problem for the scale up of these reaction procedures, as it is increasingly difficult to rapidly inject larger volumes of chalcogen precursor and the time needed for the solution to mix completely increases. This can lead to a more polydisperse product, lowering the quality of the resulting nanoparticles. By using the cadmium polyate precursor, the chalcogen precursor can be separately prepared and added at low temperatures and allowed to mix completely. After a homogenous solution is obtained, the temperature can then be increased to induce nucleation of the nanoparticles, as seen in FIG. 4b. This development provides a potential path towards large scale production of QD nanoparticles that would be needed for a number of important applications.

Figure 5:
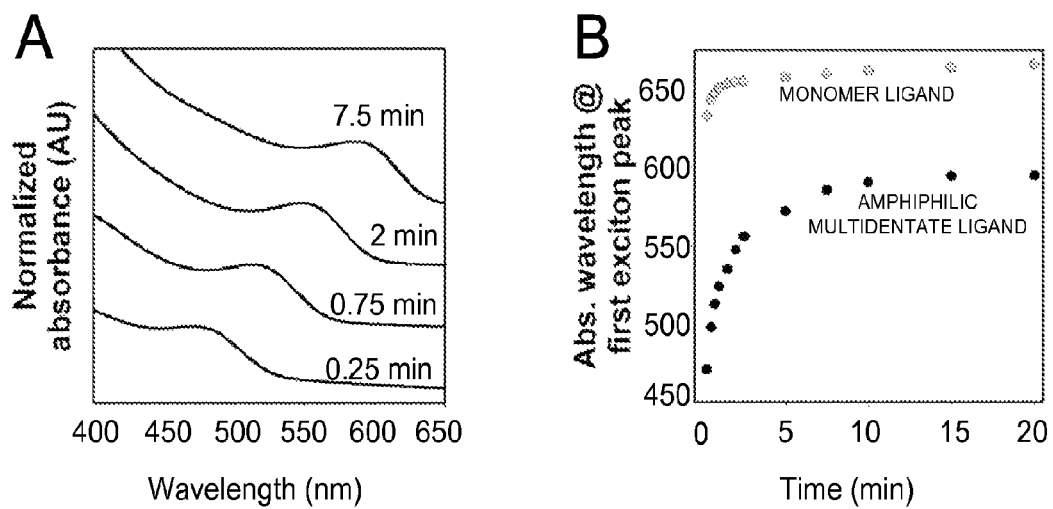
FIGS. 5A to 5B illustrate reaction kinetics of CdTe core synthesis.

Next, the overall growth rate of the nanoparticles synthesized using multidentate ligands was directly compared to procedures using monodentate oleic acid precursors. CdTe core synthesis reactions were carried out under identical conditions, with a COOH:cadmium ratio of 6:1 for both procedures (FIGS. 5A and 5B). The polymer synthesis procedure resulted in a very slow nanocrystal growth, as evidenced by the absorption spectra taken over time (FIG. 5A). In fact, depending on the polymer concentration, the nanocrystals were still growing after more than 10 minutes at 270° C. In contrast, QDs synthesized with oleic acid precursors grew very rapidly and were much quicker to plateau (FIG. 5B). This again is attributed to the increased steric hindrance of the polymer ligands as well as multivalency. As the nanoparticles are formed and grow, it is believed that the polymer is able bind the surface of the QD in a multivalent fashion (see diagram in FIG. 1B). Assuming the $k_{on}$ and $k_{off}$ rates are similar for carboxylic acids in oleic acid and the amphiphilic polymer when binding to the nanoparticle surface, multivalent binding will result in an effective $k_d$ (dissociation constant) that is lower than for monovalent binding (meaning an effectively higher binding affinity). Because of this higher affinity, the deposition of cadmium and chalcogen monomers on the surface of QDs protected by polymer ligands is expected to be significantly slowed, which is consistent with the data. In addition, a single amphiphilic polymer is more than 12 times the size of an oleic acid molecule (~3500 Da vs. 282.5 Da), which may also slow the kinetics down through steric effects.

Figure 6:
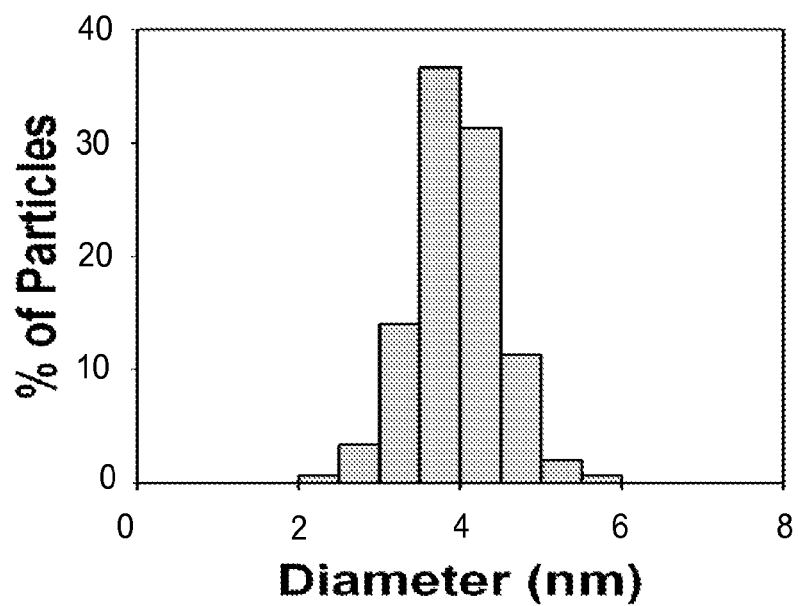
FIG. 6 is a size histogram of CdTe cores. CdTe core QDs were synthesized using the polymer procedure. A transmission electron micrograph was taken and analyzed to determine size distribution of the particles (mean diameter=4.2 nm, standard deviation~10%).

Particle Size Characterization:

Size monodispersity for QDs prepared using multidentate polymer precursors in PEG is comparable to nanoparticles produced using traditional monovalent ligands in high temperature organic solvents. TEM was performed on samples and analyzed to develop a size histogram for the QDs (FIG. 6). In a characteristic sample, prepared nanocrystals had a mean diameter of 4.2 nm with a standard deviation of approximately 10%.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, ±6%, ±7%, ±8%, ±9%, or ±10%, or more of the numerical value(s) being modified. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim the following:

1. A structure comprising a quantum dot, said structure made by:
   a) mixing an amphiphilic polymer dissolved in a non-coordinating solvent with a first precursor to produce a carboxylate precursor;
   b) mixing an excess amount of the carboxylate precursor with a second precursor to form a quantum dot core;
   c) mixing the quantum dot core and the excess amount of the carboxylate precursor with a precursor selected from the group consisting of: a third precursor, a fourth precursor, and a combination thereof, to form a quantum dot cap on the quantum dot core to form a quantum dot, wherein the quantum dot includes a layer of amphiphilic polymer disposed on the surface of the quantum dot and attached to the quantum dot by interaction through carboxyl groups of the carboxylate precursor, said amphiphilic polymer having hydrophobic multidentate ligands extending from the quantum dot; and
   d) contacting the quantum dot generated in step (c) and the excess amount of the carboxylate precursor with water to generate an outer layer of amphiphilic polymer moieties disposed on the quantum dot generated in step (c) by a hydrophobic interaction between the multidentate ligands extending from the quantum dot and from the excess carboxylate precursor, said outer layer having hydrophilic carboxyl groups exposed at the outer surface of the structure.

2. A structure comprising a quantum dot, said structure made by:
   a) mixing an excess amount of an amphiphilic polymer dissolved in PEG with a CdO to produce a carboxylate precursor;
   b) mixing the carboxylate precursor with a tellurium precursor to form a CdTe core;
   c) mixing the CdTe quantum dot core with a selenium precursor to form a CdSe cap on the CdTe core to form a CdTe/CdSe quantum dot, wherein the CdTe/CdSe quantum dot includes a layer of an amphiphilic multidentate polymer disposed on the surface of the CdTe/CdSe quantum dot, and wherein said amphiphilic multidentate polymer is attached to the quantum dot by interaction through carboxyl groups of the carboxylate precursor, said amphiphilic polymer having hydrophobic multidentate ligands extending from the quantum dot; and
   (d) contacting the quantum dot generated in step (c) and the excess amount of the carboxylate precursor with water to generate an outer layer of amphiphilic polymer moieties disposed on the quantum dot generated in step (c) by a hydrophobic interaction between the multidentate ligands extending from the quantum dot and from the excess carboxylate precursor, said outer layer having hydrophilic carboxyl groups exposed at the outer surface of the structure.

3. A structure comprising a quantum dot comprising a CdSe cap on a CdTe core to form a CdTe/CdSe quantum dot, wherein the CdTe/CdSe quantum dot further includes a layer of an amphiphilic multidentate polymer disposed on the surface of the CdTe/CdSe quantum dot, wherein said amphiphilic multidentate polymer is attached to the quantum dot by interaction through carboxyl groups of a carboxylate precursor, said amphiphilic polymer having hydrophobic multidentate ligands extending from the quantum dot, and an outer layer of amphiphilic polymer moieties disposed thereon by a hydrophobic interaction between the multidentate ligands extending from the quantum dot and from an excess amount of the carboxylate precursor, said outer layer having hydrophilic carboxyl groups exposed at the outer surface of the structure.

4. The quantum dot of claim 3, wherein the multidentate ligands have aliphatic chains having 2 to 20 carbons each.

5. The quantum dot of claim 3, wherein the amphiphilic multidentate polymer is a polymer selected from the group consisting of: poly(acrylic acid)-dodecylamine, poly(acrylic acid)-octylamine, poly(maleic anhydride-alt-1-octadecene, poly(maleic anhydride-alt-1-tetradecene, and any combination thereof.

6. The quantum dot of claim 3, wherein the CdTe core is about 1.5 to 10 nm.

7. The quantum dot of claim 3, wherein the CdTe/CdSe quantum dot has the characteristic of being soluble in a solvent selected from the group consisting of: water, acetone, dimethylformamide (DMF), dimethyl sulfoxide (DMSO), methanol, ethanol, propanol, butanol, chloroform, dichloromethane (DCM), tetrahydrofuran (THF), toluene, and any combination thereof.

* * * * *